United States Patent [19]

Wreede et al.

[11] 3,965,461
[45] June 22, 1976

[54] THERMOPLASTIC IMAGE RECORDING SYSTEM

[75] Inventors: John E. Wreede, Monrovia; Terence C. Stoddard, West Covina; Kenneth R. Erikson, Orange County, all of Calif.

[73] Assignee: McDonnell Douglas Corporation, Long Beach, Calif.

[22] Filed: Apr. 30, 1975

[21] Appl. No.: 573,135

[52] U.S. Cl. .................. 340/173 TP; 346/74 TP
[51] Int. Cl.$^2$ .................. G11C 11/46; G11C 7/00
[58] Field of Search ............ 340/173 TP; 346/74 TP

[56] References Cited
OTHER PUBLICATIONS

Gayner et al., Photoplastic Recording, Photographic Science and Engineering, vol. 7, No. 4, July–Aug. 1963, pp. 209–213.

*Primary Examiner*—Stuart N. Hecker
*Attorney, Agent, or Firm*—Marvin H. Kleinberg

[57] ABSTRACT

Erasable thermoplastic image recording systems having extended useful lifetimes are provided by subjecting the thermoplastic recording medium to a sequence of erasure, exposure to incident radiation cooling and projection in an inert atmosphere while applying corona charge throughout the erasure and exposure cycles. By exposing at a time when the medium is cooling from the erasure step, a heat development step is eliminated which eliminates nearly 50% of the thermal degradation of the thermoplastic polymer. Exclusion of oxygen from the system eliminates the considerable chemical degradation the film suffers from reaction with ozone. Erasure in the presence of a uniform corona charge provides more complete erasure than standard procedures. Lower temperature and shorter heating pulses are permitted with a lower surface tension thermoplastic polymer provided by external plastization of the thermoplastic. The lower surface tension also results in less noisy images and greater lifetimes. Compared to existing art, the system is significantly simplified, less expensive to construct and operate, and further provides faster recycling of the recording media as one heating cycle and one cooling cycle are eliminated. The system is adaptable to a recyclable storage system for holographic movies in which frames of the media are applied near the circumference of a rigid disc substrate and a motor sequences the frames through the steps of erasure, exposure and projection such that all steps take place at the same time but on different portions of the disc. The system is particularly useful for projection of acoustic holograms which cannot be viewed directly by conventional optics.

13 Claims, 5 Drawing Figures

THERMOPLASTIC IMAGE RECORDING SYSTEM

BACKGROUND OF THE INVENTION

1. Field of the Invention

The present invention relates to an information recording and retrieval system and, more particularly, to an improved, extended lifetime, thermoplastic, erasable, recording medium and apparatus.

2. Description of the Prior Art

Thermoplastic image recording systems are well known in the art. An image is formed in a molten thermoplastic material via the deformation forces caused by an electrostatic charge distribution corresponding to the image. The image is retained by cooling the thermoplastic material below its softening point. A schlieren optical system is then used to view the image.

The electrostatic charges corresponding to the image can be placed on the thermoplastic directly with a modulated electron beam or indirectly through dissipation of portions of a uniform corona (or electron beam) charge through a photoconductive layer placed in contact with the termoplastic. If a photoconductive layer is used, the imaging system will be light sensitive. As in most electrostatic systems, however, the modulation transfer function (MTF) curve of thermoplastic imaging systems is sharply peaked. This makes the system generally unsuitable for ordinary camera photography. However, thermoplastic imaging is suitable for systems such as xeroradiography where edge enchancement is desired and holography where the image information is placed on a "carrier spatial frequency". Thermoplastic imaging is especially suitable for holography as the peak in the MTF curve can be easily matched to the fringe spacing of the hologram by varying the thickness of the thermoplastic layer.

Holography is an information recording process in which the diffraction pattern of an object illuminated with coherent radiation such as light is recorded on a radiation sensitive layer. This record, known as a hologram, is then used to reconstruct an image-forming waveform by reilluminating the hologram with coherent electromagnetic radiation usually in the visible portion of the electromagnetic spectrum. Holography has many advantages contrasted with other information recording systems. For example, a hologram may be utilized to reconstruct a three-dimensional image. The holograms may be used to transmit and store information in an efficient manner. They may also be used to rapidly provide many copies of the original image. Holograms have been recorded on conventional silver halide emulsion films or using electrostatic deformation of thermoplastics.

Silver halide photographic recording plates require extremely difficult and complex chemical processing to produce holograms and are expensive in the high resolution form required for holography. Processing to the point where the film can be projected or holographically reconstructed is relatively slow and even with the highest resolution films the silver halide grains in the emulsion remain as discrete particles which scatter light and introduce noise. Silver halide films have the advantage of forming a permanent record, but also have the disadvantage of not being reusable to make different holograms at a later time.

The thermoplastic deformation type films are even more expensive than the silver halide systems and therefore generally utilized in applications in which an image is recorded and erased many times. The standard erasable thermoplastic image recording devices have limited lifetimes because of chemical and thermal degradation inherently present in the system. Photography and optical holography is usually practiced under ambient conditions in the presence of air and the polymeric films utilized for the deformation layer are subject to oxidative degradation by ozone generated by the corona necessary for electrostatic deformation. Furthermore, the typical erasure system involves a heating step for development of the imager after exposure, cooling before projection and then a separate heating and cooling step for erasure. The repetitive thermal cycling causes considerable thermal degradation of the polymer.

There inherent limitations have been recognized by workers in the art and attempts to minimize these effects have involved the development of exotic copolymers with internal plastization. These polymers are more stable than commonly used thermoplastics but still have limited lifetimes as image recording systems.

SUMMARY OF THE INVENTION

The extended lifetime thermoplastic image recording system of the invention eliminates the main cause of chemical degradation and eliminates nearly one-half of the thermal degradation of the polymer considerably extending the lifetime of the recording medium. The image recording system of the invention also provides a more complete and cleaner erasure. Thus, the invention will more than double the useful lifetime of thermoplastic imagery devices. Another advantage of the system of the invention is the greater simplicity of the sequencing technique resulting in a less expensive design for the system. Furthermore, recycling time is considerably reduced in systems that continuously and rapidly reuse the recording medium.

The extended lifetime recording system of the invention provides these advantages by an erasable sequence in which the same heat pulse is utilized to erase the film and "develop" a new image. The entire sequence is conducted in an invert atmosphere and with a uniform corona charge being continuously applied throughout the sequence. The thermoplastic imaging device is cycled through the sequence of erasure, exposure, cooling and projection. The exposure phase begins 0.1 to 2 seconds after the erasure heating pulse and projection can begin 0.2 to 10 seconds after exposure. Elimination of the separate heat development step of standard procedures eliminates nearly 50% of the thermal degradation of the polymer. Slightly more than half of the degradation remains as the heat cycle which has been eliminated would normally be of either lower temperature or shorter duration. Absence of oxygen eliminates considerable degradation resulting from ozone. The erasure step, being accomplished in the presence of a uniform charge, will result in a more complete erasure than standard procedures.

In another aspect of the invention, better results are provided with a lower surface tension polymer suitably affected by addition of an external plasticizer. The lower viscosity and surface tension provided by external plastization results in longer lifetimes and less noisy images than other techniques. By applying the corona charge continuously, high voltage switching is eliminated. Faster recycling of the recording medium is possible as one heating cycle and one cooling cycle are eliminated.

The image recording system, although primarily useful for those devices in which images are to be recorded, played back and erased in rapid sequence, will find advantage with all erasable thermoplastic devices. The invention will find use in thermoplastic image recording for near real-time acoustic holography and for thermoplastic erasable computer memories.

These and many other attendant advantages of the invention will become readily apparent as the invention becomes better understood by reference to the following detailed description when considered in conjunction with the accompanying drawings.

DESCRIPTION OF THE PREFERRED EMBODIMENTS

Figure 1:
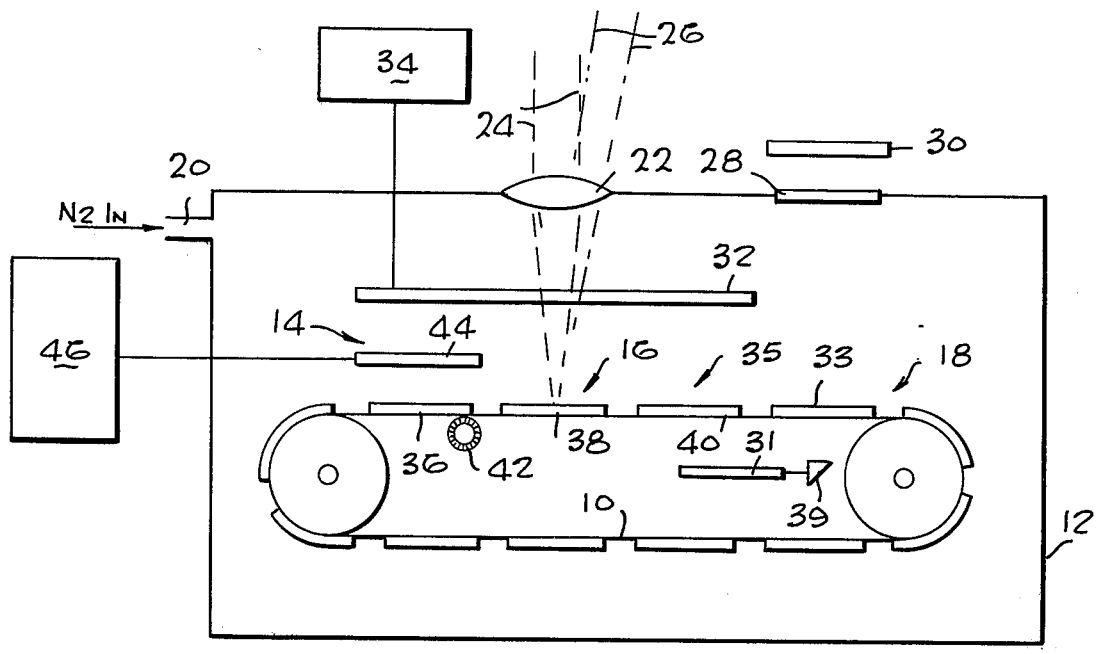
FIG. 1 is a schematic view of an image recording system in accordance with the invention.

Referring now to FIG. 1, the extended lifetime, thermoplastic image recording system comprises a multi-frame, continuous recording media 10 mounted in an enclosure 12 for step-wise translation past the heating station 14, image recording station 16 and read-out projection station 18. The enclosure 12 has an inlet 20 for receiving a steady flow of nitrogen or other inert gas so as to exclude oxygen and ozone from the system. The enclosure 12 also contains a window 22 which may be a lens to allow the information containing light beam 24 and in the case of optical hologram recording, the reference beam 26, to impinge on a portion 38 of the thermoplastic recording medium 10. A window 28, which may be a lens, is also provided in the enclosure 12 aligned with the read-out station 18 such that projection light from source 31 is directed by a prism 39 through a portion 33 of the recording medium 10 and passes through the window 28 and is read-out or otherwise used at station 30. A corona-producing electrode 32 powered by an electrical source 34 continuously applies a corona charge of single polarity to the portions 36, 38 and 40 of the recording media which are within the heating station 14, image recording station 16 and cooling station 35, respectively. A bus bar or brush 42 may be applied to the interior surface of the film to electrically ground the film during application of the corona during travel of the film through the heating, imaging and cooling stations of the device.

The heating pulse is suitably applied in one embodiment by means of a microwave or infrared energy source 44 powered by unit 46 adapted to project to the previously imaged portion 36 a short pulse of energy, which is absorbed in the form of heat, so as to render the recording medium into a fluid condition to erase all previously recorded images while under the influence of the corona discharge from the electrode 32. In other embodiments, heating can be accomplished by passing an electrical current through a suitably conductive, thin film contained within or on the surface of the medium 10 or by a jet burst of filtered hot nitrogen gas. While the portion 36 is in fluid condition, it is moved into the image recording station 16 and light beam 24 (and 26 if used) impart patterns onto portion 36 which develop under the influence of the corona charge during cooling before portion 36 is moved into the read-out station 18.

Figure 2:
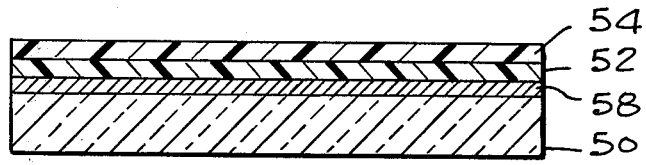
FIG. 2 is a cross-sectional view of a deformation type thermoplastic recording medium in accordance with the invention.

The recording medium as shown in FIG. 2 generally comprises an optically transparent substrate 50, an optically transparent electrically conductive, thin film 58, a photoconductive insulating layer 52, a deformable insulating thermoplastic layer 54 and a bus bar contact 59 as is well known in the art.

The deformable insulating thermoplastic layer 54 should have the following properties: (1) optical transparency, (2) viscosity at the melting point of $10^4$ poise to $10^6$ poise, (3) softening point of 50–100°C, preferably from 50°C to 65°C, (4) viscosity at room temperature greater than $10^7$ poise, preferably $10^{12}$ poise, (5) electrical resistivity of $10^{14}$ ohm/cm or greater, and (6) ability to be case into a 0.5 to 5 micrometer thick layer, preferably 0.75 to 2 micrometers in thickness.

The deformable insulating layer 54 may be formed of any suitable insulating thermoplastic having the desired melting point and capable of being readily rendered fluid by a short heat pulse so as to erase any images. Thermal stability is also a requirement. The material should be able to remain fluid such that exposure can be initiated 0.1 to 2 seconds after the erasure heat pulse. The layer 54 should also cool sufficiently such that projection can proceed 0.2 to 10 seconds after exposure. The exact period for each step and the sequencing will depend on the properties of the layer, the energy input of the heat pulse and the duration thereof.

Improved results and provided with lower surface tension polymers. The use of an external plasticizer, which makes use of means outside of the polymer molecule to plasticize it, enables the use of polymers having a lower surface tension and viscosity. Particularly good results are obtained when a plasticizer such as a lower alkyl ester such as a 0.1 to 5 weight percent of dialkylphthalate is blended with the insulating thermoplastic such as 1% of diethylphthalate based on 100 parts of stabelite ester 10 resin. The plasticized lower surface tenion polymers increase lifetime of the imaging film and provide less noisy images. Typical insulating thermoplastics having the desired viscosity, melting point, surface tension, are vinyl polymers or copolymers with dienes, rosins, gums and silicone polymers. Representative polymers are copolymers of 30–60 mol percent styrene and 40–65 mol percent of m-butyl methacrylate; 10–20 percent isoprene, 60–75 percent styrene and 5–15 percent methyl acrylate; 1,3-di-(o-phenylphenoxy)- 1,3-diphenyl-1,3-dimethyl disiloxane; 4'-m-terphenethyl-o-diphenyl methyl ether; 36% Styron PS-2 with Chlorowax 70; Saran F-120 which is a copolymer of vinyl chloride and vinylidene chloride; Vinylite VYCM; polyvinyl chlorides, polyvinyl alcohols; 3-amino-carbazole with vinyl polymers or polyesters or natural resins; staybelite, staybelite ester 10; or Velsicol X-37. Other suitable materials include the glycerol and pentaerythritol esters of partially hydrogenated rosin, polyalphamethylstyrene, copolymers of styrene indene and isoprene, polyterpene resins made from beta-pinene such as the Piccolyte resins having melting points from 50–65°C, Coumarrone indene resins, phenol formaldehyde resins, chlorinated polyphenyl resins, alkyd resins and mixtures of the foregoing.

The photoconductive layer 52 is preferably transparent, has a high electrical resistivity and a melting point above that of the thermoplastic layer 54. The layer 52 may be formed of a dispersion of photoconductive material in an inorganic insulating binder. For example, photoconductive pigments such as cadmium sulfide, cadmium selenide, zinc sulfide, zinc selenide, zinc oxide, zinc telluride, gallium triselenide, gallium telluride or copper phthalocyanine may be dispersed in a binder such as polystyrene, a silicone resin, a styrene-butadiene copolymer or the like.

The photoconductive material may be organic, especially when complexed with an organic charge transfer complexing agent. Typical organic photoconductors are 1,4-dicyano-naphthalene; anthracene-3-benzylidene amino carbozole; 2,5-bis(p-amino-phenyl-1) 1,3,4-oxidiazole; vinyl carbozole; polyvinyl carbazole; 2,4-diphenyl quinazoline; and phthalocyanines and quinacridones in solution or dispersed in the above-described film forming binders.

A representative photoconductive layer 52 can be formed from a 2 micron thick layer of a 1:1 stoichiometric mixture of poly-N-vinyl carbazole and 2,4,7-trinitro-9-fluoroenone which has a spectral sensitivity in the green portion of the visible spectrum and is particularly suitable for use with a xenon laser emittin at 5353A.

Figure 3:
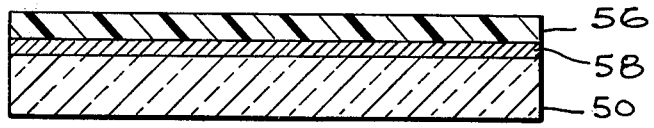
FIG. 3 is a cross-sectional view of a further embodiment of a deformation type thermoplastic recording medium.

The functions of layers 52 and 54 may be combined into a single layer 56 as shown in FIG. 3. This can be accomplished by compounding the photoconductive with thermoplastic resins such that the layer 56 has a high melting point and a narrow melting range as defined above. The photoconductor may be a dispersion salt solution or copolymerized or reacted with the thermoplastic polymer. For example, a pure polymer such as poly-N-vinyl carbazole or phenolformaldehyde having a melting point between 50°C and 65°C can be rendered photoconductive by complexing it with 2,4,7-trinitro-9-fluorenone or other suitable Lewis acid.

The substrate 50 is a transparent material which may be a flexible, high-melting point synthetic, organic polymer such as polyethylene terephthalate, polycarbonate or polyurethane or the like optionally coated with a thin, optically transparent, electrically conductive layer 58 of a metal or metal salt such as gold, tin, copper, or tin oxide, indium oxide, copper iodide or the like. The substrate may also be formed of a rigid, inorganic material such as glass which may be preferred is some applications because of the better optical qualities provided by glass. The conductive layer 58 is preferentially placed between substrate and the photoconductive layer, but it may be provided on the back of the substrate.

Figure 4:
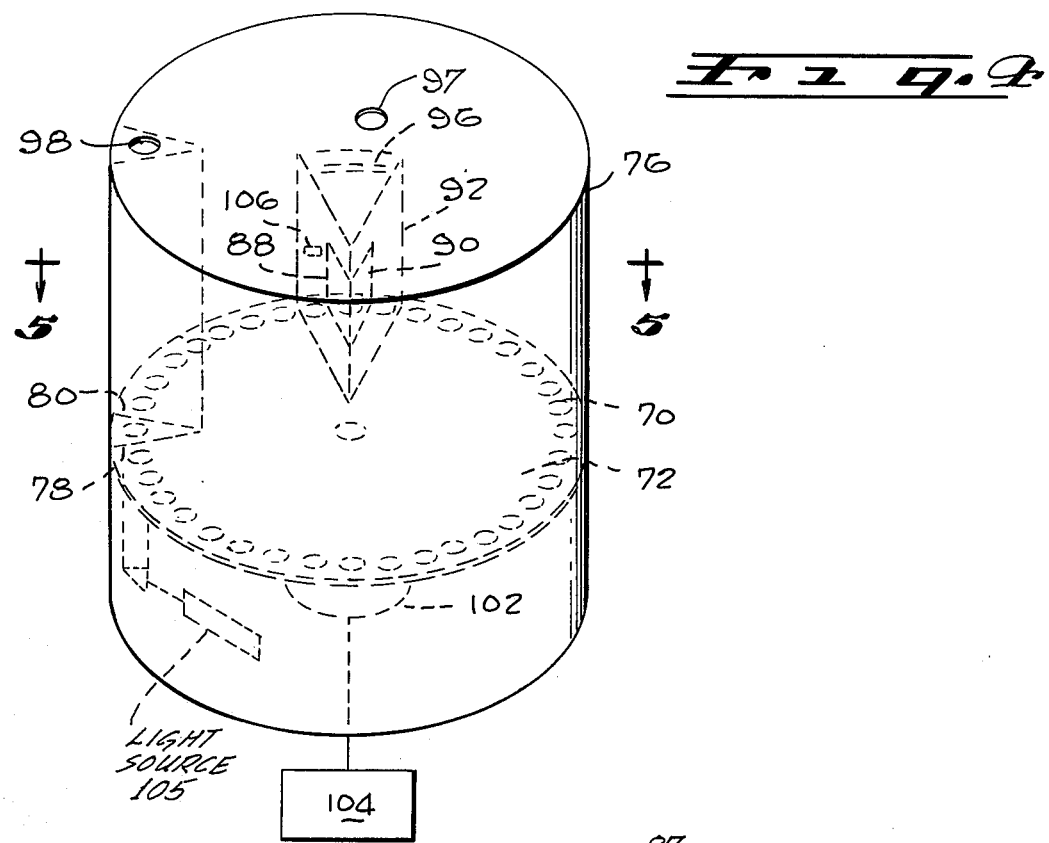
FIG. 4 is a top plan view of a continuous, recyclable, image storage and information retrieval system in accordance with the invention.
Figure 5:
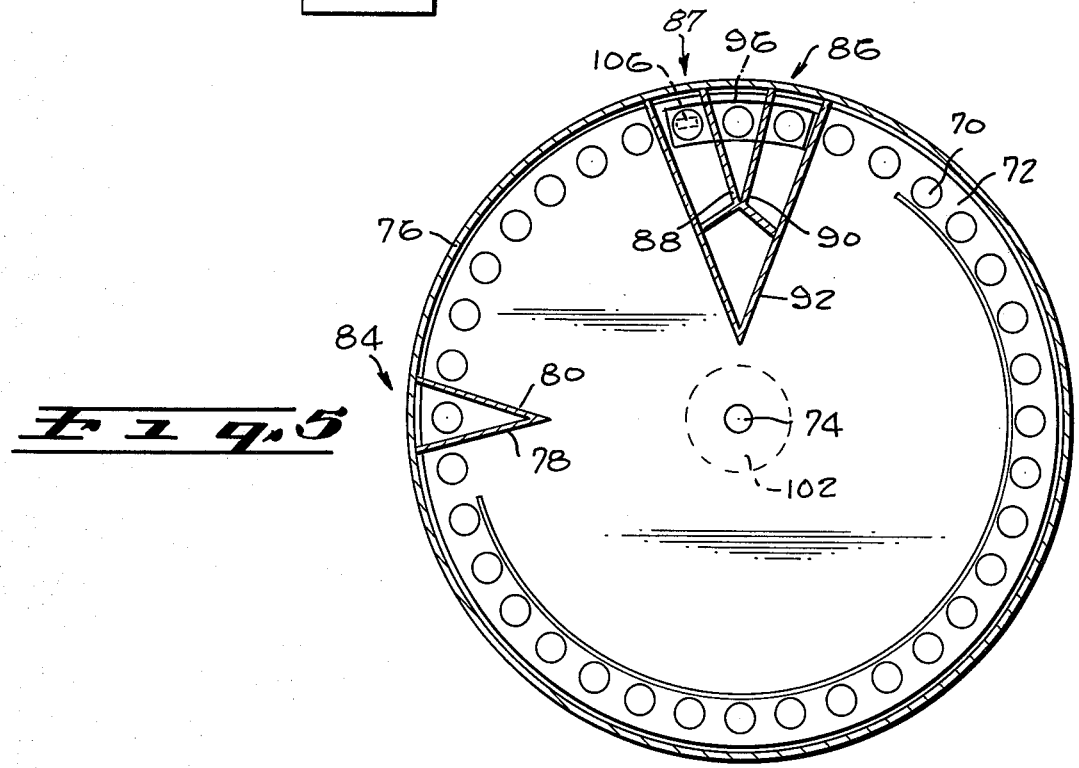
FIG. 5 is a sectional view taken along line 5—5 of FIG. 4.

The use of a rigid glass substrate is particularly useful in the embodiment of the invention as illustrated in FIGS. 4 and 5. In the system of this embodiment, a continuous layer 70 of recording medium which may include the photoconductive layer 52 and thermoplastic layer 54 of FIG. 2 or the combined photoconductive, thermoplastic, deformable layer 56 of FIG. 3 is applied in a strip at the circumference of a rotatable, rigid disc 72 which is preferably transparent. In a similar embodiment, segments 70a of recording material are applied to the disc to form frames as in a conventional motion picture film. The disc is mounted on a rotatable shaft 74 and is mounted within nitrogen filled enclosure 76. Baffles 78 and 80 mounted on the enclosure 76 isolate the projection station 84 from the rest of the device and baffles 88 and 90 isolate the exposure station 86 from the rest of the device. Window 97 is provided to pass the light beam to be recorded throught enclosure 76. An enclosure 92 is formed over the erasure, exposure and image recording stations such that the corona generating electrode 96 may apply charge continuously to the frames within these stations only. The device also includes a light projection source 105 arranged below the disc 72 within the projection station 84 and the enclosure has a window 98 adapted to pass the projected beam and for subsequent use. A heating source 106 is mounted within the enclosure 92 above the erasure section 87.

A motor 102 which may be a stepping motor in some applications, actuated by sequencer/controller 104 sequences the portion 70 through the erasure of the previous image, image recording, cooling and projection steps such that all steps take place at the same time but on different portions of the disc 72. However, sequencing would be such that the exposure phase comes on 0.1 to 2 seconds after the erasure heating pulse and projection can begin 0.2 to 10 seconds after exposure.

Thus, there has been taught a thermoplastic image recording system having distinct advantages of considerably extended lifetime of the recording medium and cleaner erasure of previously recorded images. These advantages are obtained by a combination of techniques. The same heat pulse is used to erase the film as is used to develop a new image, thereby eliminating the separate heat development step. The process is carried out in an inert atmosphere thereby eliminating the degradation which normally is caused by ozone generated by the action of the static discharge on the surrounding air. Because the erasure step is carried out in the presence of a uniform electrical charge, a more complete erasure is obtained. The use of an external plasticizer enables lower viscosity and surface tension thereby contributing to longer lifetimes and image noise reduction.

It is to be realized that only preferred embodiments of the invention have been described and that numerous substitutions, alterations and modifications may be made without departing from the spirit and scope of the invention as defined in the following claims.

What is claimed is:

1. A method for utilizing a thermoplastic recording medium comprising the steps of:
   1. heating the medium to a temperature sufficient to erase a previous image;
   2. exposing the medium while cooling from step (1) to record a new image;
   3. cooling the medium.

2. A method according to claim 1 further including the step of projecting the recorded image after or during step (3).

3. A method according to claim 2 in which said projection step beings 0.2 to 10 seconds after step (2).

4. A method according to claim 1 further including conducting steps (1), (2) and (3) in an inert atmosphere.

5. A method according to claim 1 further comprising applying a uniform electrostatic charge to the medium during step (3).

6. A method according to claim 1 in which step (2) is conducted within 0.1 to 2 seconds after step (1).

7. A method according to claim 1 in which the recording medium includes a thermoplastic recording layer comprising an externally plasticized thermoplastic polymer.

8. A method according to claim 1 in which a continuous layer of thermoplastic recording medium is applied to a common support and several portions of the continuous layer are simultaneously subjected to steps (1), (2), (3) and (4).

9. A method according to claim 1 in which a plurality of frames of thermoplastic recording medium are mounted on a common support and a plurality of said frames are simultaneously subjected to Steps (1), (2), (3) and (4).

10. A recording system comprising in combination:
a support;
thermoplastic recording medium mounted on said support;
means for heating a portion of the recording medium;
means for exposing light to a portion of the recording medium;
means for moving the heated portion from the heating means to the imaging means before the heated frame cools; and
means for applying a uniform electrostatic charge to the portion of said medium while it is undergoing heating and exposure.

11. A system according to claim 10 further including means for enclosing the system and means for filling the enclosure means with inert gas.

12. A system according to claim 10 further including means for cooling at least one imaged frame and projection means for reading at least one imaged frame.

13. The system of claim 10 further comprising means for applying a uniform electrostatic charge to the portion of said medium while it is undergoing cooling.

* * * * *